(12) United States Patent
Furuya et al.

(10) Patent No.: US 7,737,037 B2
(45) Date of Patent: Jun. 15, 2010

(54) SEMICONDUCTOR DEVICE AND METHOD OF MANUFACTURING THE SAME

(75) Inventors: Akira Furuya, Kanagawa (JP); Nobuyuki Otsuka, Ibaraki (JP); Hiroshi Okamura, Ibaraki (JP); Shinichi Ogawa, Ibaraki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/178,151

(22) Filed: Jul. 23, 2008

(65) Prior Publication Data

US 2008/0293247 A1 Nov. 27, 2008

Related U.S. Application Data

(62) Division of application No. 11/283,769, filed on Nov. 22, 2005.

(30) Foreign Application Priority Data

Nov. 29, 2004 (JP) .............................. 2004-343443

(51) Int. Cl.
*H01L 21/44* (2006.01)
(52) U.S. Cl. ............................... 438/685; 257/E21.584
(58) Field of Classification Search ................. 438/685; 257/E21.292, E21.293, E21.584
See application file for complete search history.

(56) References Cited

U.S. PATENT DOCUMENTS

| | | | | |
|---|---|---|---|---|
| 4,847,111 A | * | 7/1989 | Chow et al. .................. | 438/586 |
| 6,528,419 B1 | * | 3/2003 | Kordic et al. ................ | 438/675 |
| 6,534,405 B1 | * | 3/2003 | Wu ............................ | 438/682 |
| 6,586,330 B1 | * | 7/2003 | Ludviksson et al. ......... | 438/643 |
| 2003/0190813 A1 | * | 10/2003 | Huang et al. ................ | 438/710 |
| 2005/0009325 A1 | * | 1/2005 | Chung et al. ................ | 438/637 |

FOREIGN PATENT DOCUMENTS

| | | |
|---|---|---|
| JP | 2001-298028 | 10/2001 |
| JP | 2002-319618 | 10/2002 |
| JP | 2003-017493 | 1/2003 |
| JP | 2004-343443 | 11/2004 |

OTHER PUBLICATIONS

Japanese Patent Office issued a Japanese Office Action dated Sep. 15, 2009, Application No. 2004-343443.

* cited by examiner

*Primary Examiner*—Charles D Garber
*Assistant Examiner*—Stanetta D Isaac
(74) *Attorney, Agent, or Firm*—Young & Thompson

(57) ABSTRACT

An object of the invention is to provide a semiconductor device which includes a barrier metal having high adhesiveness and diffusion barrier properties and a method of manufacturing the semiconductor device. The invention provides a semiconductor device manufacturing method including forming a first layer made of a material containing silicon on a base substance; forming a second layer containing metal and nitrogen on the first layer; and exposing the second layer to active species obtained from plasma in an atmosphere including reducing gas.

7 Claims, 11 Drawing Sheets

SEMICONDUCTOR DEVICE AND METHOD OF MANUFACTURING THE SAME

This application is based on Japanese Patent application No. 2004-343443, the content of which is incorporated hereinto by reference.

BACKGROUND

1. Technical Field

The present invention relates to a semiconductor device and a method of manufacturing the same, particularly to the semiconductor device which has an insulating interlayer and uses a Cu (copper) interconnect and the method of manufacturing the same.

2. Related Art

In recent semiconductor devices represented by a 65-nm node generation, delay of signal propagation in an interconnect is known as a rate-controlling factor in device operation. A delay constant at the interconnect is expressed by a product of interconnect resistance and capacitance among the interconnect. Therefore, in order to increase speed of the device operation by decreasing the interconnect resistance and capacitance among the interconnect, a material (hereinafter referred to as "low dielectric constant material") having a specific dielectric constant smaller than that of $SiO_2$ is used as the material for the insulating interlayer, and Cu (copper) having smaller specific resistance is being used as the interconnect material.

A Cu multi-layer interconnect is frequently formed by a damascene process.

FIG. 11 is a process cross-sectional view showing a main part of the damascene process.

Namely, as shown in FIG. 11A, first an insulating interlayer 220 made of the low dielectric constant material is formed on a base substance 200 such as a silicon (Si) substrate. Then, as shown in FIG. 11B, an opening H is made in the insulating interlayer 220. The opening H has a role of an interconnect trench for an interconnect layer or a via hole for via. Then, as shown in FIG. 11C, a barrier metal layer 210 is formed in an inner wall of the opening H. As shown in FIG. 11D, an opening H is filled with a Cu layer 300 as the interconnect material. At this point, in many cases where an opening H is filled with the Cu layer 300, Cu is deposited in a thin-film shape by a physical vapor deposition (PVD) method, an opening H is filled with the Cu layer 300 by electrolytic plating method that uses the Cu thin film as a cathode electrode.

In the damascene process, a filled structure shown in FIG. 11D is formed by removing a barrier metal 240 and the Cu layer 300, deposited outside the opening H, by chemical mechanical polishing (CMP) after the barrier metal layer 210 and the Cu layer are deposited.

In this case, the barrier metal layer 210 prevents Cu diffusion into the base substance 200 such as the silicon substrate, improves adhesiveness between the insulating interlayer 220 and the Cu layer 300, and prevents oxidation of the Cu layer 300.

In the barrier metal layer 210, it is difficult that compatibility between the diffusion barrier properties and the adhesiveness. Therefore, in the present circumstances, the barrier metal layer 210 is formed by combination of an amorphous film and a crystalline film. Specifically, the barrier metal layer 210 is formed by a multilayered film including an amorphous film of TaN (tantalum nitride) film with no crystal grain boundary which becomes a high speed diffusion channel and a crystalline Ta film having the adhesiveness to Cu.

Currently one of the most studied techniques as a method of forming the barrier metal is the physical vapor deposition (PVD) method. However, because the PVD method has a worse step coverage, a thickness of a side wall portion is decreased when compared with the thickness of a bottom portion in the interconnect trench or the via hole. In order to decrease the interconnect resistance, it is desirable that the barrier metal is thinned. However, in the PVD method, it is difficult that the thin film is conformaly formed, so that another technique is required in order to form the barrier metal having the thickness of not more than 10 nm.

Therefore, it is demanded that the barrier metal is formed by a chemical vapor deposition (CVD) method. In the CVD method, thin film is easily formed with the good step coverage when compared with the PVD method. Recently the barrier metal is being developed by an atomic layer deposition (ALD) method (or atomic layer chemical vapor deposition (ALCVD) method). The ALD method is of a kind of the CVD method. In the ALD method, when compared with the conventional CVD method, the conformal film is easily obtained with the good step coverage. As one cycle of a depositing procedure of the ALD method, after a first raw material containing an element A is saturation-adsorbed on the substrate, a second raw material containing an element B is supplied to the substrate to react with the first raw material saturation-adsorbed on the substrate, which forms a compound AB. The layer consisting of compound AB having the desired thickness is formed by repeating the above cycle by the predetermined number of times.

When a complicated pattern is formed by CVD method, generally the higher step coverage is obtained in reaction rate-controlling in which a deposition rate is determined by reaction of the raw material on the substrate rather than in supply rate-controlling in which the deposition rate is determined by the supply of the raw material.

Because a deposition principle is the reaction rate controlling in the ideal ALD method, the ALD method is excellent in the step coverage properties and the uniformity of the film thickness when compared with the conventional CD method. In the ALD method, the saturation adsorption is utilized, so that the thickness formed in one cycle is kept constant and thickness controllability is excellent. Further, film composition uniformity is also excellent because the composition is determined by the number of valences of the first raw material and the second raw material.

The barrier metal formed by the ALD method is used in the thin film while the thickness is about several nanometers, so that anitride of high melting point metal which is non-solid-soluble in Cu is used as the material for the barrier metal such that high diffusion barrier properties are obtained. TaN, TaCN, WN, WCN, and TiN can be cited as examples of the barrier metal formed by the ALD method. These materials are formed by performing reduction and nitriding to a metallic compound such as an organometallic compound and a metallic halide with a nitrogen compound such as $NH_3$. These films often have the high resistance. In order to improve the high resistance properties, a method of reducing resistivity of the film by performing plasma treatment to increase density is disclosed (see Japanese Laid-open patent publication NO. 2002-151437).

The barrier metal formed by the ALD method is excellent in the diffusion barrier properties of Cu while the barrier metal has the low adhesiveness. As described above, currently the combination of the amorphous film and the crystalline film is used in order that the diffusion barrier properties are compatible with the adhesiveness in the barrier metal. However, in the ALD method, since the film formation is performed by the saturation adsorption mechanism, it is easy to stably obtain the given composition and the crystalline film while it is difficult to obtain the different compositions and the crystalline film.

A method of forming high melting point metal silicide nitride by mixing silicon is proposed as the technique of improving the adhesiveness. In the ALD method, the following method can be considered as the method of forming the silicide nitride.

(1) the method in which the reduction and the nitriding are performed with the nitrogen compound such as $NH_3$ after the metallic compound and the silicon compound are simultaneously supplied and saturation-adsorbed onto the substrate, (2) the method in which the reduction and nitriding are performed to the metallic compound to perform the reduction and silicification with the silicon compound, and (3) the method in which the reduction and the silicification of the metallic compound are performed with $SiH_4$ or the like to perform the reduction and the nitriding of the metallic compound.

However, because a temperature at which the metallic compound is saturation-adsorbed differs from a temperature at which the silicon compound is saturation-adsorbed, in the methods described in (1) and (2), it is difficult to select the raw material. Further, in the method described in (3), there is a concern that impurities such as organic materials and halogens and the like remain due to inadequacy of reduction power of $SiH_4$.

Therefore, the semiconductor device which includes the barrier metal having the high adhesiveness and diffusion barrier properties and the method of manufacturing the semiconductor device are demanded.

SUMMARY OF THE INVENTION

According to the present invention, there is provided a method of manufacturing a semiconductor device, comprising forming a first layer made of a material containing silicon on a base substance;

forming a second layer containing metal and nitrogen on the first layer; and exposing the second layer to active species obtained from plasma in an atmosphere including reducing gas.

According to the present invention, there is provided a semiconductor device, comprising a base substance which includes a semiconductor layer;

an insulating interlayer which is provided on the base substance;

a barrier metal layer which is provided along an inner wall of an opening provided in the insulating interlayer; and a conducting film which is provided on the barrier metal layer, the opening being filled with the conducting film, wherein the barrier metal layer contains metal, silicon, and nitrogen, a concentration of the silicon in the barrier metal layer is decreased from the insulating interlayer toward the conducting film.

Thus, according to the invention, the semiconductor device which includes the barrier metal having the high adhesiveness and diffusion barrier properties and the method of manufacturing the semiconductor device can be provided, and there is generated a large industrial advantage.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invent ion is not limited to the embodiments illustrated for explanatory purposed.

Embodiments of the invention will be described in detail with reference to the drawings.

Figure 1:
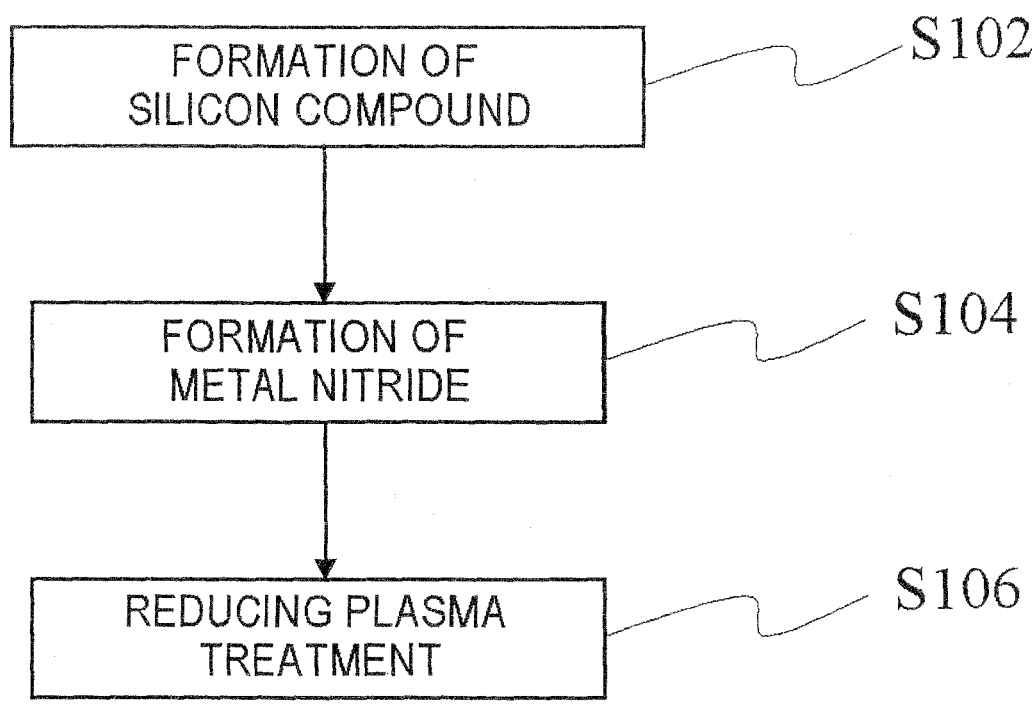
FIG. 1 is a flowchart showing a main part of a method of manufacturing a semiconductor device according to an embodiment of the invention.

FIG. 1 is a flowchart showing a main part of a method of manufacturing a semiconductor device according to an embodiment of the invention.

FIGS. 2A to 2D is a process cross-sectional view showing the main part of the method of manufacturing the semiconductor device according to the embodiment.

Figure 2A:
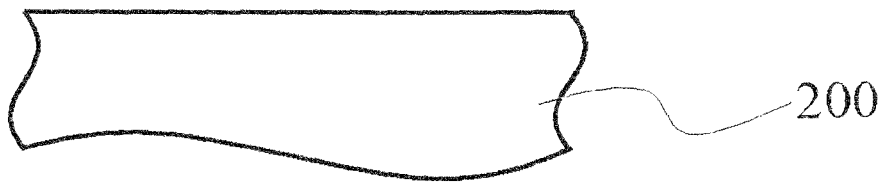
FIGS. 2A to 2D is a process cross-sectional view showing a main part of a method of manufacturing a semiconductor device according to an embodiment of the invention.
Figure 2B:
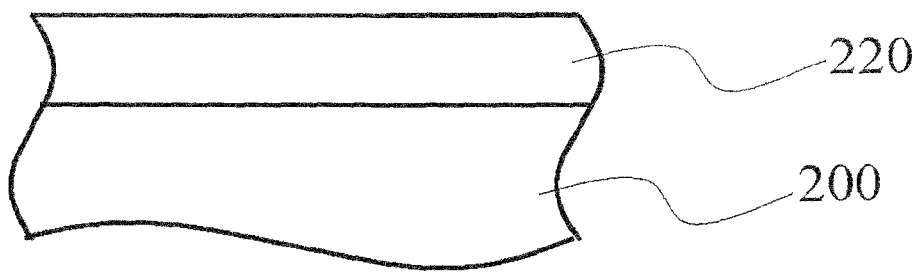

In the embodiment, as shown in FIGS. 2A and 2B, a silicon compound 220 is formed on the base substance 200 (Step S102). As described later, a semiconductor wafer on which elements such as a transistor are formed is used as the base substance 200. A compound of silicon and oxygen (O), carbon (C), hydrogen (H), nitrogen (N), and the like can be used as the silicon compound 220. Specifically, for example, silicon oxide whose thickness ranges from 20 to 100 nm can be formed as the silicon compound 220. Silicon carbide, silicon nitride, silicon oxycarbide, silicon oxynitride, silicon carbonitride, silicon oxycarbonitride, and the like can be used as the material for the silicon compound 220.

Various methods such as the CVD method, a sputtering method, vapor deposition, and a spin coat method can be used as the method of forming the silicon compound 220.

Figure 2C:
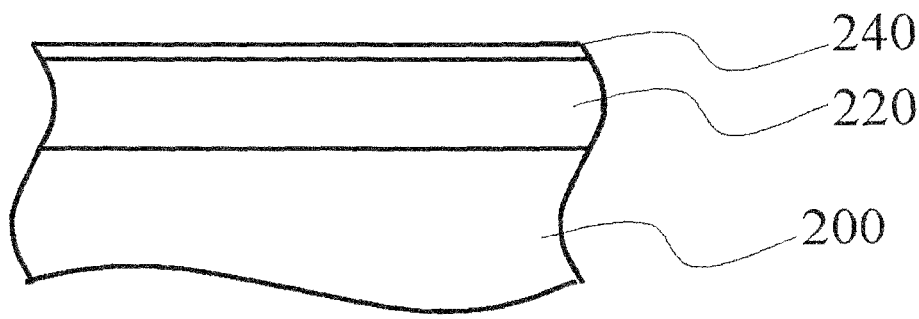

Then, as shown in FIG. 2C, a metal nitride 240 is formed on the silicon compound 220 (Step S104). The metal nitride 240 contains metal and nitrogen. The material containing the nitrogen and tantalum (Ta), titanium (Ti), tungsten (W), zirconium (Zr), and the like can be used as the metal nitride 240. The atomic layer deposit ion (ALD) method (or atomic layer chemical vapor deposition (ALCVD) method) can be used as the method of forming the metal nitride 240.

Specifically, for example, TaN whose thickness ranges from 1 to 5 nm can be formed as the metal nitride 240 by the ALD method. As described later, the material containing the high melting point metal and nitrogen is suitable to the material for the barrier metal which is provided on the inner wall of the via hole and the like. TaN, WN, TiN, ZrN, TaCN, WCN, TiCN, ZrCN, and the like can be cited as a material of the barrier metal. In the case of the use of these compounds, it is not necessary that the compound has a stoichiometric composition.

The thickness of the metal nitride 240 can be set at several nanometers. When the thickness of the metal nitride 240 is thin, the compound containing silicon, metal, and nitrogen can substantially be formed by the later-mentioned plasma treatment in the whole of the metal nitride 240. On the other hand, when the thickness of the metal nitride 240 is thick, sometimes a depth profile is generated by the plasma treatment in concentrations of metal and silicon. Specifically sometimes the depth profile, in which the metal concentration is relatively high on the near a surface, and the silicon concentration is increased as a depth from the surface is increased, is formed.

Figure 2D:
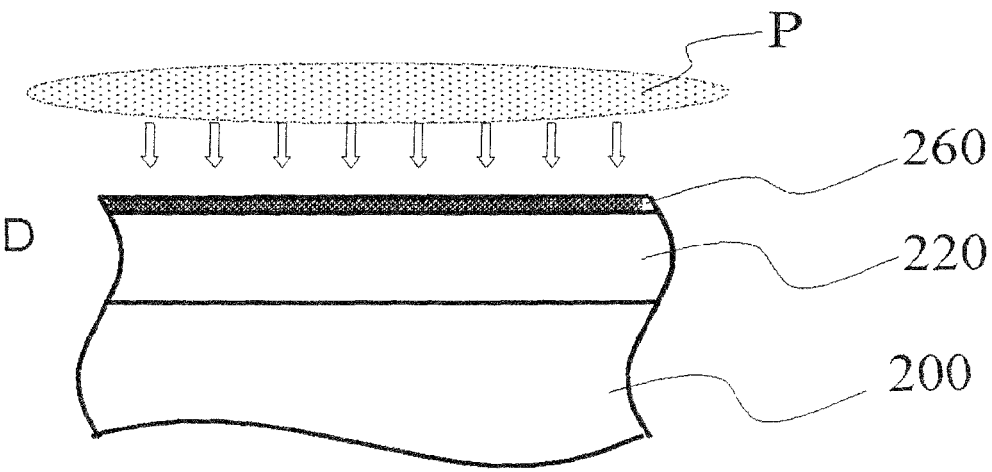

After the metal nitride 240 is formed, as shown in FIG. 2D, the plasma treatment is performed with plasma P in a reducing gas atmosphere (Step S106). The plasma P of gas including the reducing gas is generated, and active species formed by the plasma P are caused to act on the surface of the metal nitride 240. For example, mixed gas of hydrogen ($H_2$) and helium (He) can be used as the reducing gas. The mixed gas of nitrogen ($N_2$) and hydrogen or the gas including $NH_3$ may be used.

Figure 3:
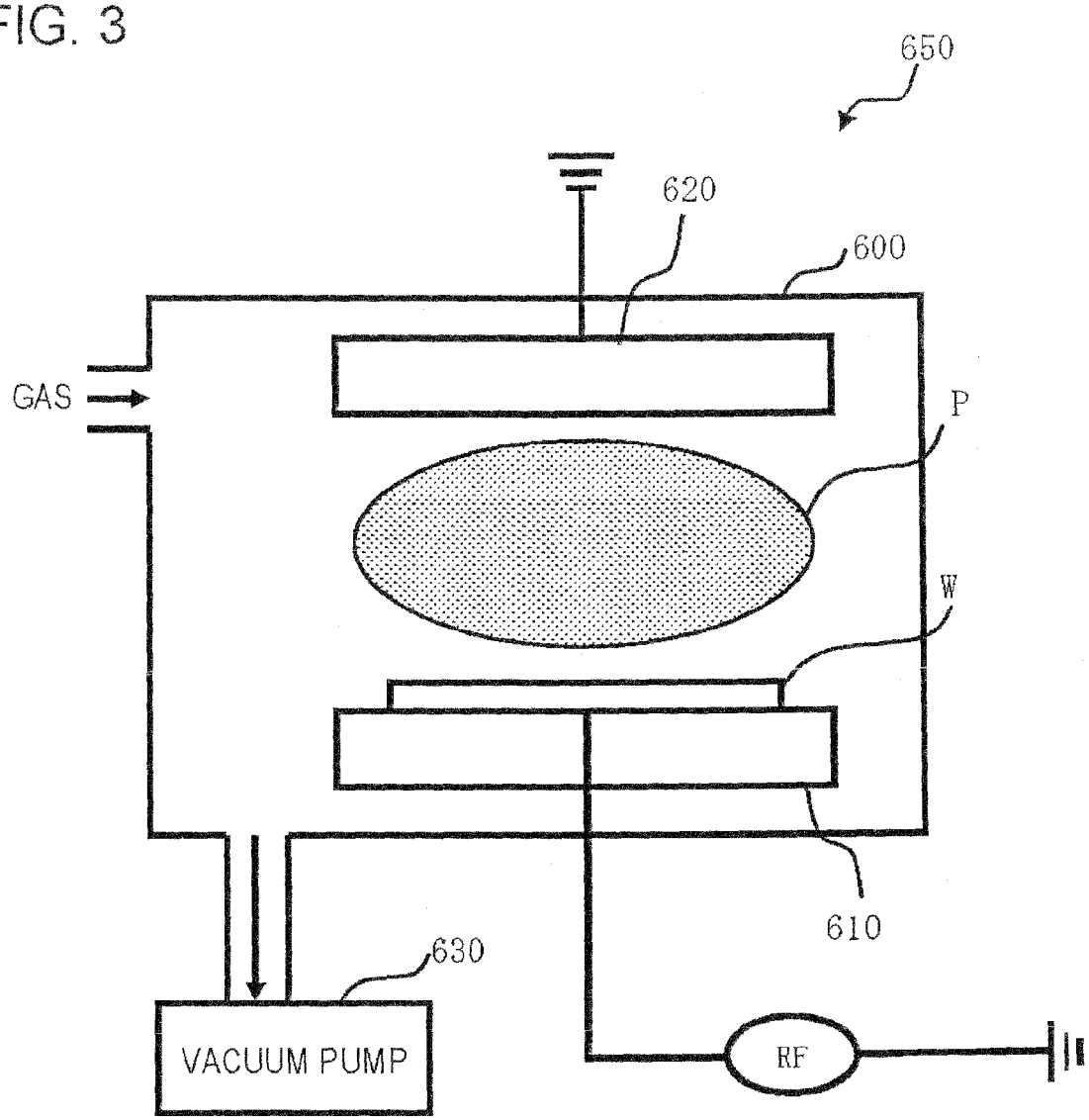
FIG. 3 is a conceptual diagram illustrating a configuration of an apparatus for generating plasma P.

FIG. 3 is a conceptual diagram illustrating a configuration of an apparatus for generating plasma P.

In a plasma treatment apparatus 650, a semiconductor substrate W which becomes the base substance is placed on a lower electrode 610 inside a chamber 600. Then, the mixed gas is supplied to the inside of the chamber 600, and the plasma P is generated with a high-frequency power source between an upper electrode 620 and the lower electrode 610 inside the chamber 600 which is evacuated to a predetermined pressure by a vacuum pump 630.

When the metal nitride 240 is irradiated with the plasma P of the gas including the reducing gas using the plasma treatment apparatus 650, the metal nitride 240 is changed to a metal silicide-nitride 260 containing silicon. This is considered as follows: The active species generated by the plasma P in the reducing gas atmosphere reduces the metal nitride 240 and lowers the nitrogen concentration, which decreases density of the metal nitride film. At the same time, the underlying silicon compound 220 is reduced to generate an isolated silicon atom, and the generated silicon atom is diffused in the metal nitride film having the low density to form a bond in the metal nitride film, which results in the formation of the metal silicide-nitride film.

In order to lower the nitrogen concentration, the reducing gas is required. The gas including the hydrogen gas ($H_2$) or the hydrogen atom (H) can be used as described above. The plasma P of the mixed gas of nitrogen ($N_2$) and hydrogen ($H_2$) or the gas including $NH_3$ may be caused to act on the metal nitride 240. However, because nitrogen (N) is a heavy element, there is a concern that the substance to be treated might have physical damage by the plasma P including the nitrogen (N). Therefore, in the case when the plasma P including the heavy element is generated, it is desirable that the damage is decreased by increasing the gas pressure to shorten mean free path of the gas species (nitrogen or the like) or by decreasing bias voltage. Such optimizations of conditions could easily be made based on the invention by a person skilled in the art.

The method of performing the plasma treatment after the deposition is also disclosed in Japanese Laid-open patent publication NO. 2002-151437. However, the method disclosed in Japanese Laid-open patent publication NO. 2002-151437 differs from the invention in that the plasma treatment is performed to increase the density of the thin film. This is attributed to the fact that the plasma of the heavy element such as argon (Ar) and nitrogen is used in Japanese Laid-open patent publication NO. 2002-151437. Further, in order to increase the density of the thin film, a method such as active application of the bias is also adopted in Japanese Laid-open patent publication NO. 2002-151437.

On the other hand, the treatment with the plasma P in the embodiment, in the reducing gas atmosphere including hydrogen enables to reduce both the metal nitride and the silicon compound and to form the compound 260 containing metal, Silicon, and nitrogen. The compound 260 has both the diffusion barrier properties and the adhesiveness, so that the compound 260 is suitable to the barrier metal of the semiconductor device. That is, silicon contained in the silicon compound 220 is diffused in the metal nitride 240 to form the metal silicide nitride 260, which allows adhesive force to be strengthened between the metal silicide nitride 260 and the silicon compound 220 to remarkably increase the adhesiveness. The metal silicide nitride 260 is also excellent in the diffusion barrier properties which prevent the diffusion of copper (Cu) or the like.

Then, an example of experimental results performed by the inventor will be described.

The silicon oxide 220 was formed on the silicon wafer 200, and tantalum nitride (TaN) 240 whose thickness is about 1 nm was formed on the silicon oxide 220 by the ALD method. The plasma treatment was performed with the plasma P of the mixed gas having helium and 10% hydrogen. In the generating conditions of the plasma P, a flow rate of the mixed gas was set in the range of 50 to 100 sccm, the pressure was set in the range of 20 to 50 Torr, and input power was set in the range of 500 to 100 watt. The treatment with the plasma P was performed for 50 to 100 seconds under the above conditions. The compositions were studied in the vicinity of the surface of the sample by an X-ray photoelectron spectroscopy for the sample to which the plasma treatment was performed and the sample to which the plasma treatment was not performed for comparison. Table 1 shows summary of the results. In Table 1, the numbers of counts (arbitrary unit) detected by the X-ray photoelectron spectroscopy are cited for nitrogen (N), tantalum (Ta), and silicon (Si).

TABLE 1

|  | N | Ta | Si |
| --- | --- | --- | --- |
| He/$H_2$ plasma | 28 | 33 | 5 |
| w/o He/$H_2$ plasma | 49 | 36 | 0 |

In the surface of the sample (w/o He/H$_2$ plasma) to which the plasma treatment was not performed, it is seen that only tantalum (Ta) and nitrogen (N) are counted while silicon (Si) is not counted. On the other hand, in the surface of the sample (He/H$_2$ plasma) to which the plasma treatment was performed, it is seen that the number of counts of tantalum is decreased and silicon is counted. In the sample to which the plasma treatment was performed, it is also seen that the number of counts of nitrogen is decreased to almost a half.

Namely, it is seen that nitrogen was extracted near the surface of the metal nitride 240 by the plasma treatment and the tantalum concentration was also decreased to a certain extent while silicon was added by the same amount by outdiffusion. As a result, it is seen that TaN constituting the metal nitride 240 prior to the plasma treatment was changed to TaSi$_x$N$_y$ (0<x<1, 0<y<1) by the plasma treatment.

Inventors also prepared the same sample as described above for another experiment. The plasma treatment was repeated 20 times to the sample under the same conditions as described above. The obtained sample was evaluated by X-ray diffraction.

Figure 4:
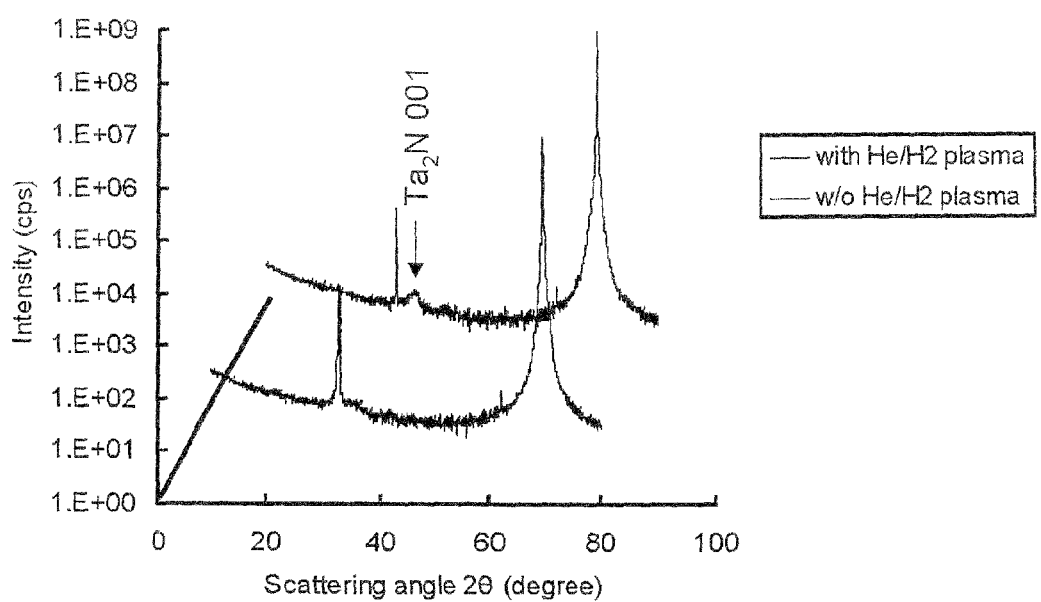
FIG. 4 is a graph showing diffraction intensity obtained by an X-ray diffraction evaluation.

FIG. 4 is a graph showing diffraction intensity obtained by the X-ray diffraction evaluation. In FIG. 4, a horizontal axis expresses diffraction angle 2θ and a vertical axis expresses intensity of diffracted X-ray.

As can be seen from this result, the sample (w/o He/H$_2$ plasma) to which the plasma treatment was not performed, no diffraction peak is observed for Ta$_2$N. On the other hand, in the sample (He/H$_2$ plasma) to which the plasma treatment was performed, a (001) diffraction peak is observed for Ta$_2$N. That is, it is seen that the nitrogen content near the surface of the metal nitride 240 is further decreased to generate Ta$_2$N whose stoichiometric composition is Ta:N 2:1 by repeating the plasma treatment.

Thus, according to the embodiment, the treatment with the plasma P including hydrogen decreases the nitrogen contents near the surface of the metal nitride 240 and also the metal content, which allows silicon in the underlying film to be diffused into the vicinity of the surface. As a result, the metal silicide-nitride having the extremely high adhesiveness to the underlying film and the excellent diffusion barrier properties to copper (Cu) or the like is obtained Further, the decrease in nitrogen content near the surface raises the relative concentration of tantalum. This is advantageous for the adhesiveness between the metal silicide-nitride and the interconnect material such as copper (Cu) formed on the metal silicide-nitride. That is, the structure similar to the structure in which tantalum nitride and tantalum are stacked is obtained. In the metal silicide-nitride obtained in the embodiment, the adhesiveness is excellent both to the underlying film and covering film and the diffusion barrier properties are also high. Therefore, the metal silicide-nitride of the embodiment is preferably used as the barrier metal.

According to the experimental results of the inventors, it is found that the treatment with the plasma P is preferably performed under the following conditions. The temperature of the substrate (to be treated) can be set in the range from room temperature to about 400° C. When the temperature is lower than the above range, an effect of the treatment with the plasma P is weakened. When the temperature is higher than the above range, sometimes thermal damage is generated to the substrate (semiconductor chip formed on the substrate).

In the case where the mixed gas of hydrogen (H$_2$) and helium (He) is used, the concentration of hydrogen can be set in the range of 0.05 to 20%. When the hydrogen (H$_2$) concentration is lower than the above range, the sufficient effect is not obtained. When the hydrogen concentration is higher than the above range, there is a concern that the damage is brought to the low dielectric constant film nor the interconnect material such as copper (Cu) which are provided in the substrate.

The pressure can be set in the range of 0.005 to 1 Torr. When the pressure is lower than the above range, the plasma is hardly generated. When the pressure is higher than the above range, the effect of the plasma treatment is hardly obtained because lives of the active species such as radical are shortened.

The gas flow rate can be set in the range of 10 to 1000 sccm. When the gas flow rate is lower than the above range, the effect of the plasma treatment is hardly obtained by such an influence that a thickness of residence film is increased. When the gas flow rate is higher than the above range, a tendency to run off from the above-described optimum pressure range is increased.

The high-frequency output can be set in the range of 50 to 2000 watt. When the high-frequency output is lower than the above range, the plasma is hardly generated. When the high-frequency output is higher than the above range, sometimes the damage to the substrate is generated or electric power loss is increased.

The treatment time per one time can be set in the range of 0.5 to 200 seconds. When the treatment time per one time is shorter than the above range, the sufficient effect is not obtained. When the treatment time per one time is longer than the above range, sometimes the damage to the substrate is generated or disadvantage is brought in throughput.

According to the result of the study of trial production by the inventor, in the case of the plasma treatment, it is found that particularly the good result is obtained under the following conditions.

substrate temperature: 20 to 150° C.
H$_2$ concentration in mixed gas of H$_2$/He: 1 to 10%
pressure: 0.01 to 0.1 Torr
flow rate: 50 to 200 scam
high-frequency power: 500 to 1000 watt
treatment time: 10 to 60 seconds Then, a second specific example of the embodiment will be described.

FIGS. 5A to 5D is a process cross-sectional view showing a main part of a method of manufacturing a semiconductor device according to a second specific example of the embodiment. The same component as one described with reference to FIGS. 1 to 4 is designated by the same reference numeral, and the detailed explanation will not be described.

Figure 5A:
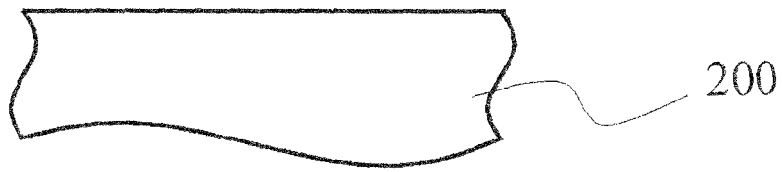
FIGS. 5A to 5D is a process cross-sectional view showing a main part of a method of manufacturing a semiconductor device according to a second specific example of an embodiment of the invention.
Figure 5B:
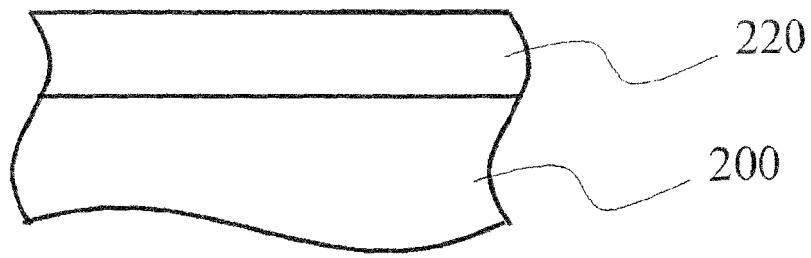
Figure 5C:
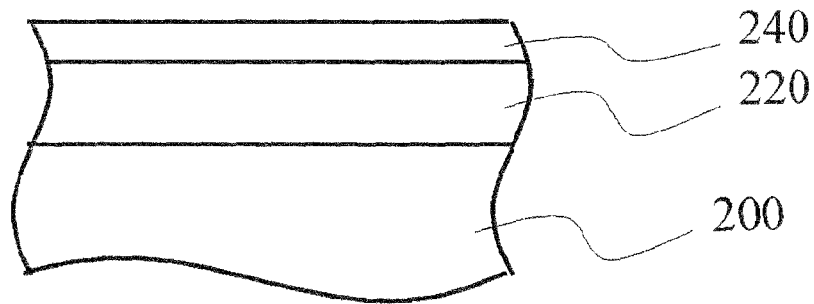

In the specific example, as shown in FIGS. 5A and 5B, similarly the silicon compound 220 is formed on the base substance 200. Then, as shown in FIG. 5C, the metal nitride 240 is formed on the silicon compound 220. However, in this case, the thickness of the metal nitride 240 is formed slightly thicker than the metal nitride 240 described with reference to FIGS. 2A to 2D. Specifically, for example, TaN whose thickness ranges from about 3 to about 10 nm can be formed by the ALD method.

Figure 5D:
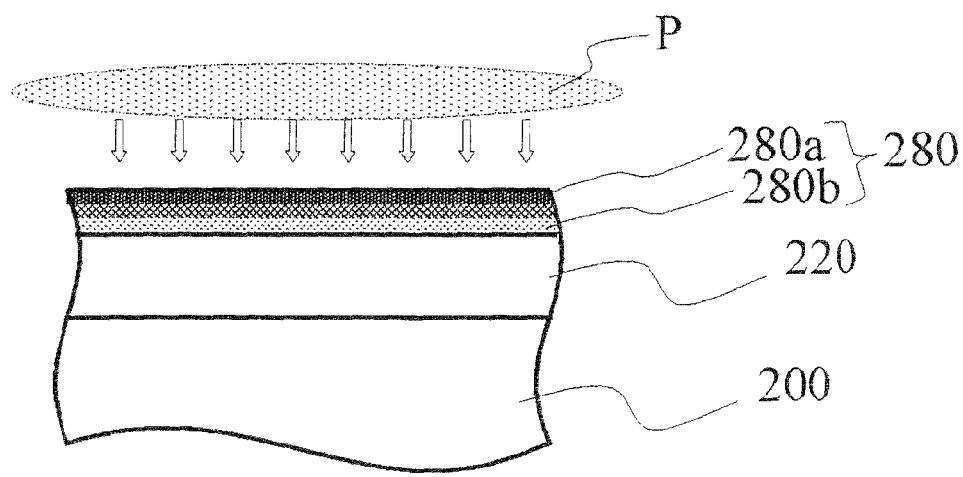

Then as shown in FIG. 5D, the plasma treatment is performed with plasma P in the reducing gas atmosphere. That is, the plasma P of the gas including the reducing gas is generated, and the surface of the metal nitride 240 is exposed to the active species formed by the plasma P. The treatment conditions with the plasma P are set similar to the conditions described with reference to FIGS. 1 to 4.

Then, the metal nitride 240 is reduced, a polycrystalline Ta$_2$N 280a is formed in the surface side of the metal nitride 240, and an amorphous TaSi$_x$N$_y$ (0<x<1, 0<y<1) 280b is formed in the substrate side. When the thickness of the metal nitride 240 is increased, the metal silicide-nitride (280b) is formed only in the surface side. This is attributed to the fact that the silicon atom diffused from the underlying film does not reach the surface side. In this case, the low density metal nitride in which nitrogen in the surface side is extracted is recrystallized to form the polycrystalline $Ta_2N$ film.

The structure in which the composition is modulated is preferably used as the barrier metal of the semiconductor device. The amorphous metal silicide-nitride 280b on the substrate side aids in largely strengthening the adhesiveness to the silicon compound 220 of the ground. On the other hand, the polycrystalline $Ta_2N$ 280a on the surface side aids in largely strengthening the adhesiveness to the interconnect material, such as copper (Cu) and aluminum (Al), formed on the polycrystalline $Ta_2N$ 280a. Further, the diffusion prevention of barrier metal film 280 that consists of these layer 280a and 280b to the interconnect material is remarkably high.

A boundary between the polycrystalline $Ta_2N$ 280a in the surface side and $TaSi_xN_y$ 280b on the substrate side is not always clear, and the concentrations of tantalum (Ta), silicon (Si), and nitrogen (N) are often continuously changed when viewed in the depth direction. That is, a transition region in which the composition is continuously changed often exists between $Ta_2N$ 280a in the surface side and $TaSi_xN_y$ 280b in the substrate side. Even in this case, the same effect is obtained. Similarly it is not always necessary that the boundary is clear between $TaSi_xN_y$ 280b and the silicon compound 220 on which $TaSi_xN_y$ is not deposited. Further, it is not always necessary that the composition of $Ta_2N$ 280a in the surface side has the stoichiometric composition. In this case, the same effect is obtained.

Then, the specific example in which the invention is applied to a process of manufacturing the interconnect part of the semiconductor device will be described.

Figure 6:
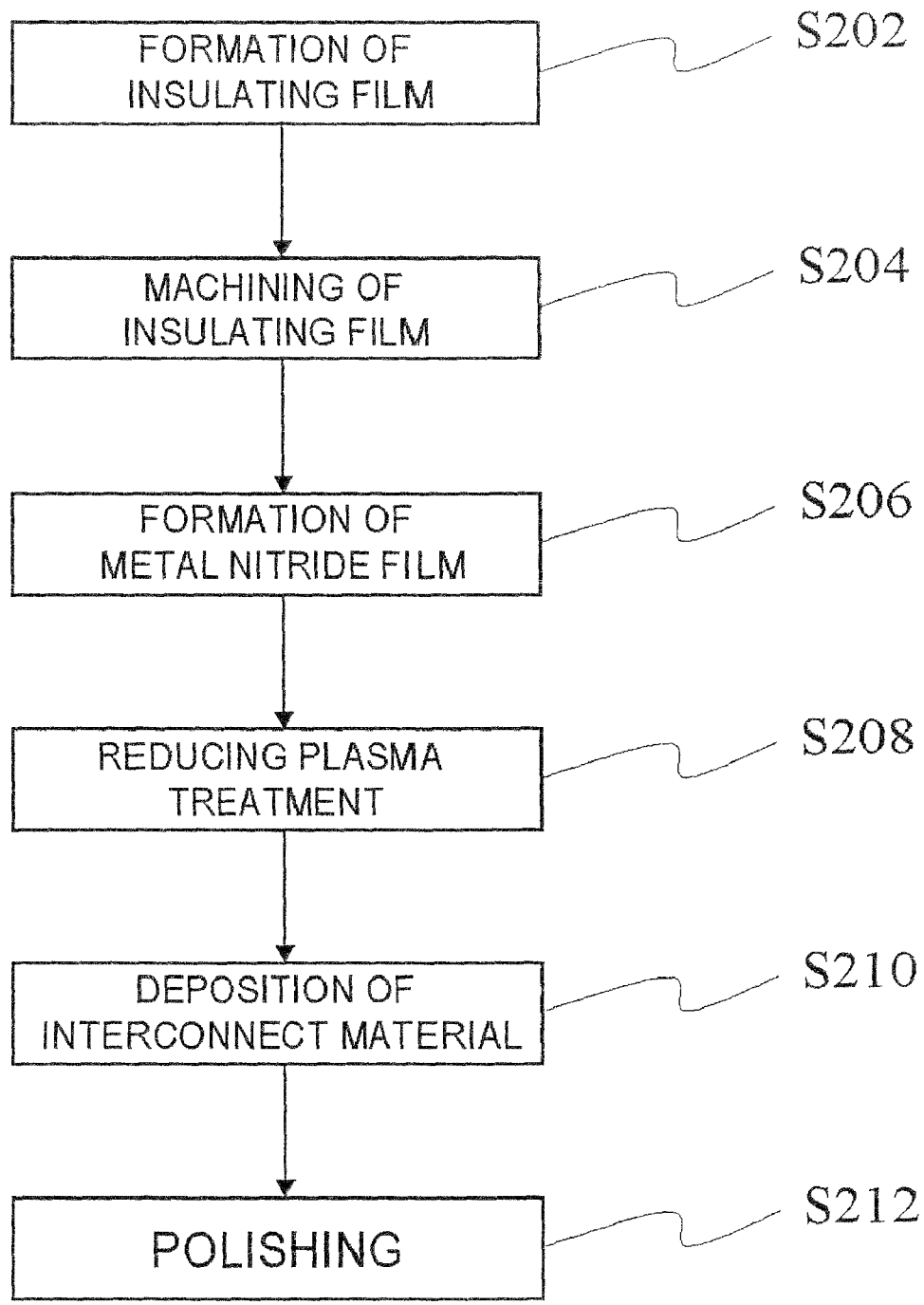
FIG. 6 is a flowchart showing a specific example of a method of manufacturing a semiconductor device according to an embodiment of the invention.

FIG. 6 is a flowchart showing a specific example of a method of manufacturing the semiconductor device according to the embodiment of the invention.

FIGS. 7 and 8 are a process cross-sectional view showing a process performed corresponding to the flowchart shown in FIG. 6.

In the specific example, a series of processes including the formation of the insulating film (Step S202), the machining of the insulating film (Step S204), formation of the metal nitride film (Step S206) reducing plasma treatment (Step S208), the deposition of the interconnect material (Step S210), and polishing (Step S212) can be realized.

The embodiment will specifically be described with reference to FIGS. 7 and 8.

Figure 7A:
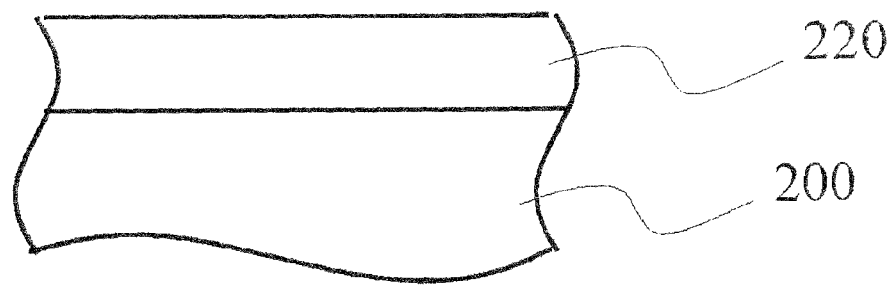
FIGS. 7A to 7C is a process cross-sectional view showing a process performed corresponding to the flowchart shown in FIG. 6.
Figure 7B:
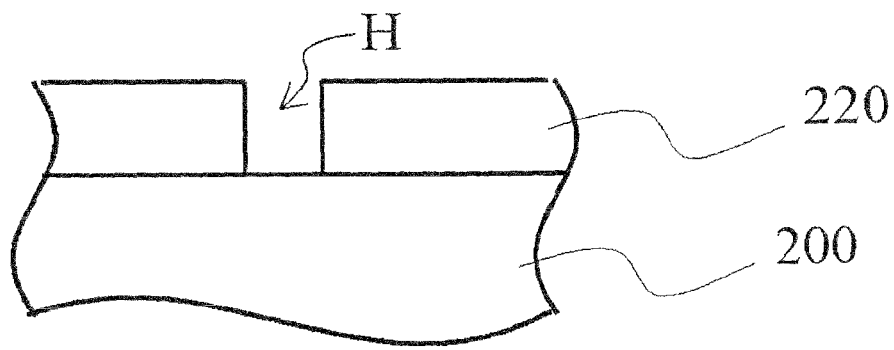

As shown in FIG. 7A, the insulating film 220 is formed on the base substance 200 such as the silicon substrate. Various elements such as a transistor and a diode, the electrodes for connecting these elements, the insulating film provided over the elements, and the like are appropriately provided in the base substance 200. For example, porous methyl silsequioxane (MSQ) can be used as the material for the insulating film 220 formed on the base substance 200. For example, a spin on glass (SOG) method, in which the thin film is formed by performing spin coat of solution followed by heat treatment, can be used as the method of forming the insulating film 220. The porous insulating film having the following physical property values is obtained by appropriately adjusting the MSQ material and the forming conditions.

density: 0.68 g/cm$^3$
vacancy rate: 54%
maximum value in distribution of vacancy diameters: 1.9 nm
specific dielectric constant: 1.81
elastic modulus: 1.6 GPa
hardness: 0.1 GPa After the insulating film 220 is formed, as shown in FIG. 7B, an opening H (via hole) is formed. With reference to the method of making the opening H, for example, a resist mask (not shown) is formed, the exposed insulating film is etched, and then the resist mask is removed by the method such as ashing.

Figure 7C:
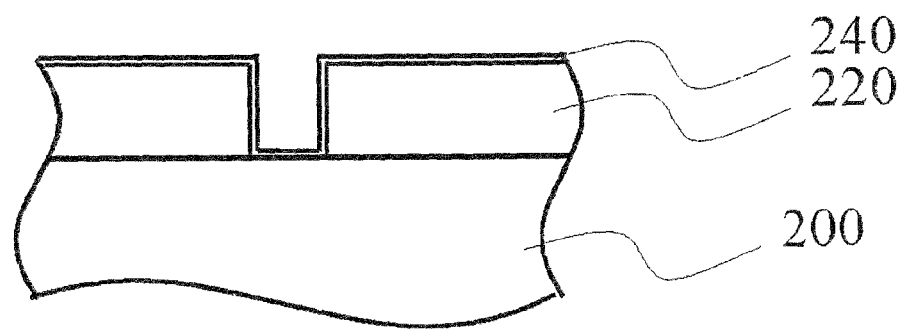

Then, as shown in FIG. 7C, the metal nitride film 240 is deposited. For example, the metal nitride film 240 can be formed by alternately supplying pentadimethyl amino tantalum $(Ta[N(CH_3)_2]_5$: PDMAT) and ammonia ($NH_3$) to form the TaN film whose thickness is about several nanometers.

Figure 8A:
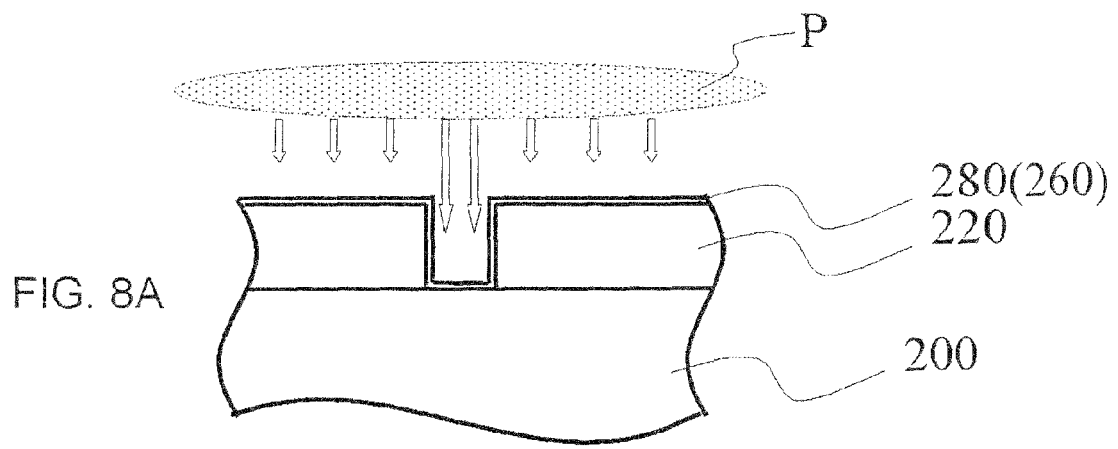
FIGS. 8A to 8C is a process cross-sectional view showing a process performed corresponding to the flowchart shown in FIG. 6.

Then, as shown in FIG. 8A, the treatment is performed with the reducing plasma P. The treatment is performed under the same conditions described with reference to FIGS. 1 to 4. When the thickness of the metal nitride film 240 is thin, or when the plasma treatment is sufficiently performed, as described above with reference to FIGS. 2A to 2D, the whole of the metal nitride film 240 is changed to a metal silicide-nitride film $TaSi_xN_y$ (0<x<1, 0<y<1) 260. On the other hand, when the thickness of the metal nitride film 240 is thick, or when the plasma treatment is not sufficiently performed, as described above with reference to FIGS. 5A to 5D, the metal nitride film 240 is changed to metal silicide-nitride film 280 in which the compositions of tantalum (Ta) and silicon (Si) are changed in the depth direction. Accordingly, the thickness of the metal nitride film 240 and the plasma treatment conditions are appropriately adjusted according to structural parameters of the device to be manufactured and material of the insulating film, which allows the barrier metal having the necessary adhesiveness and diffusion barrier properties to be formed.

Figure 8B:
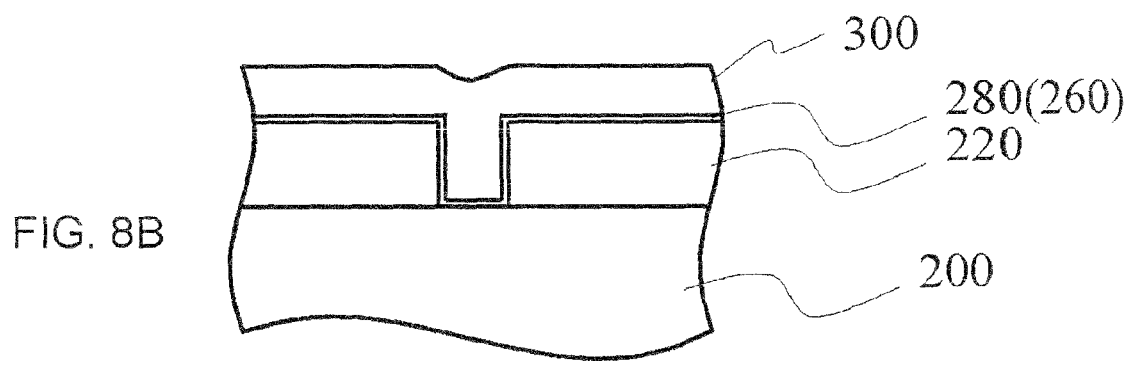

Then, as shown in FIG. 8B, an interconnect layer 300 which is of the conducting film is deposited. For example, copper (Cu) can be used as the interconnect layer 300. In order to fill the interconnect layer 300 in the opening H (via hole), the Cu thin film is formed by the physical vapor deposition (PVD) method, and Cu can be also filled in the opening H by the plating while the Cu thin film is used as a cathode electrode.

Figure 8C:
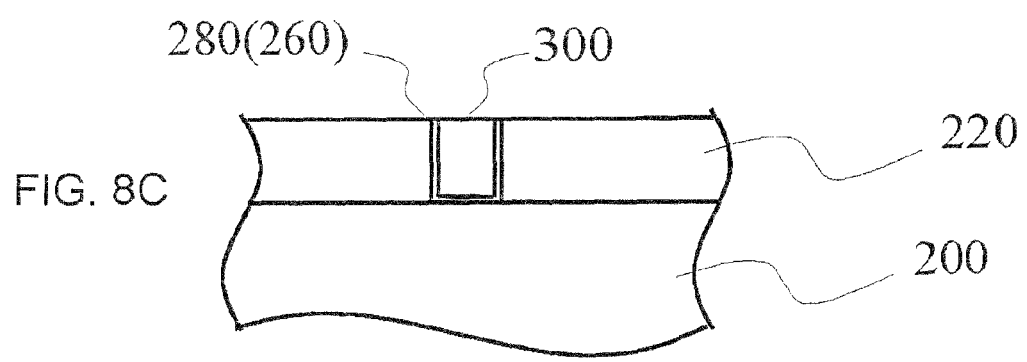

Then the interconnect layer 300 deposited on the surface of the insulating film 220 and a barrier metal layer 280 (260) beneath the interconnect layer 300 are polished and removed by a CMP method, and the filled structure shown in FIG. 8C is completed.

Thus, according to the manufacturing method of the specific example, the reducing plasma treatment is performed to the metal nitride film 240 to form the barrier metal layer 280 (260). Therefore, the interlayer interconnect structure which is excellent in the adhesiveness and the diffusion barrier properties can be realized.

Figure 9:
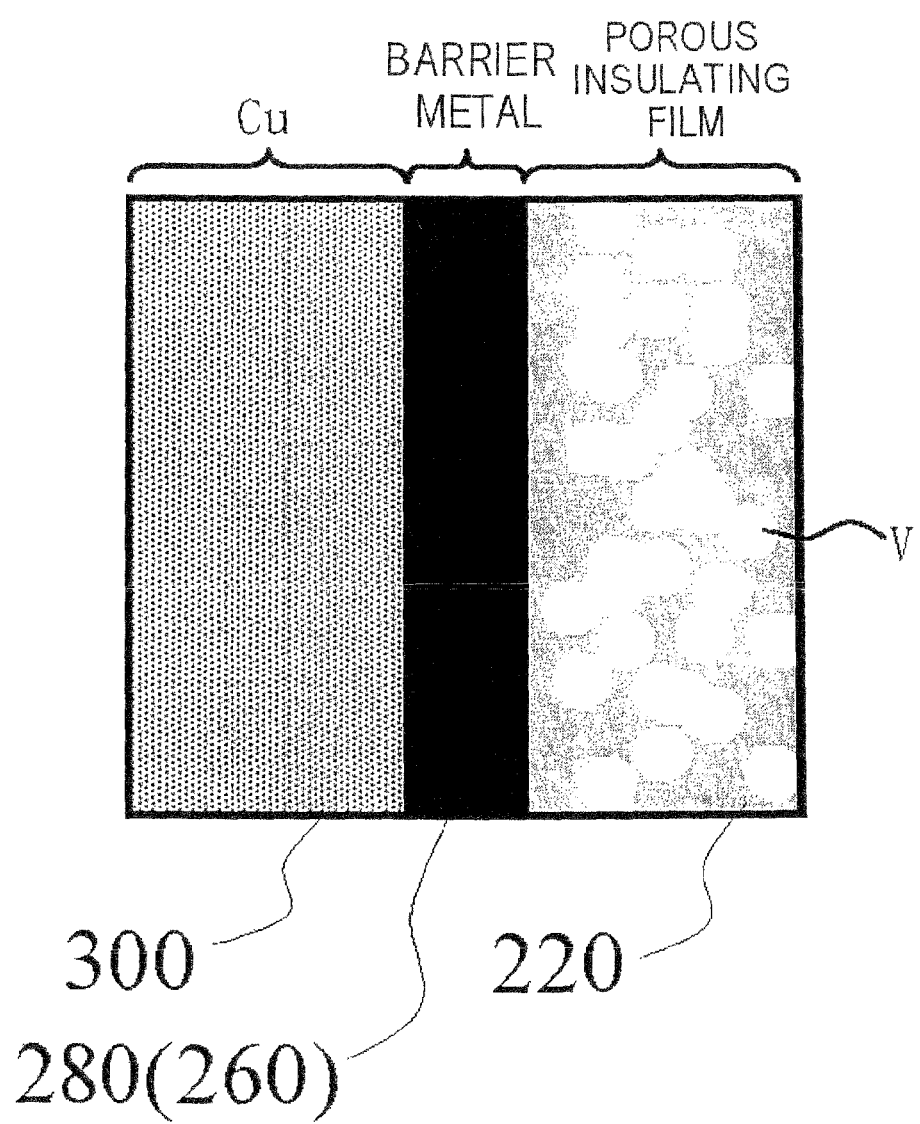
FIG. 9 is a partially enlarged cross-sectional view showing a periphery of a barrier metal formed by a specific method of the invention.

FIG. 9 is a partially enlarged cross-sectional view showing a periphery of the barrier metal formed by the specific method.

That is, FIG. 9 is the cross-sectional view showing both a bonding interface between the insulating interlayer 220 and the barrier metal layer 280 (260) and interconnect layer 300. As shown in FIG. 9, in the insulating interlayer 220 of the specific example, many micro-vacancies are formed in order to effectively decrease the dielectric constant.

However, when the porous insulating interlayer 220 and the interconnect layer 300 are in contact with each other, the metal constituting the interconnect layer 300 is diffused in the insulating interlayer 220 through the vacancies. As a result, the insulating properties such as dielectric breakdown voltage of the insulating interlayer 220 is decreased, current leakage is generated between the adjacent interconnects, and reliability of signal propagation is decreased in the interconnect. Further, the reliability of the transistor or the like is also decreased because the metal constituting the interconnect layer 300 is diffused in the semiconductor substrate 200.

On the contrary, according to the invention, the diffusion of the interconnect material can be prevented while the high adhesiveness is maintained by placing the barrier metal 280 (260) formed by the reducing plasma P.

Figure 10:
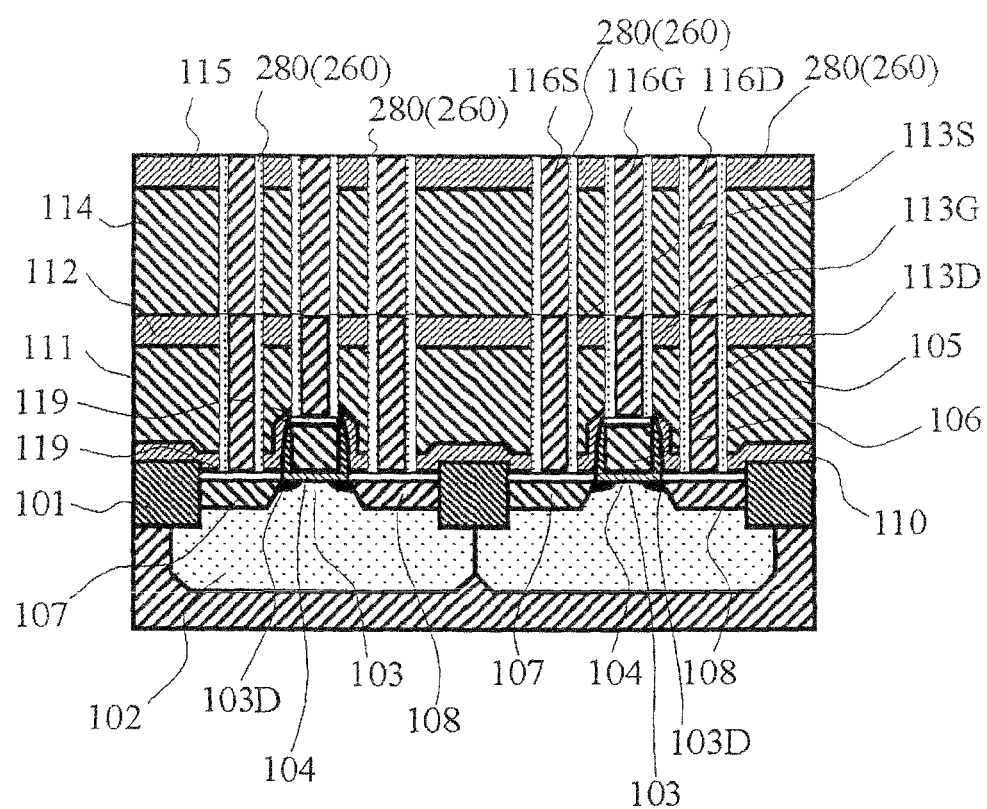
FIG. 10 is a process cross-sectional view showing a main part of a damascene process.
Figure 11A:
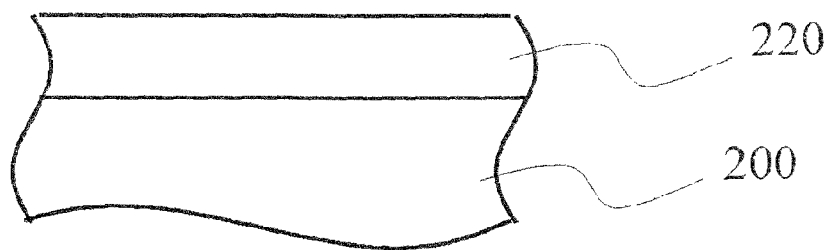
FIGS. 11A to 11D is a schematic view illustrating a main-part cross-sectional structure of a semiconductor device manufactured by a manufacturing method according to an embodiment of the invention.
Figure 11B:
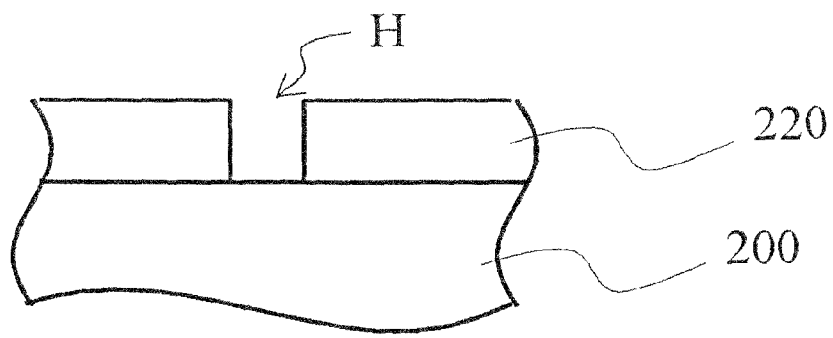
Figure 11C:
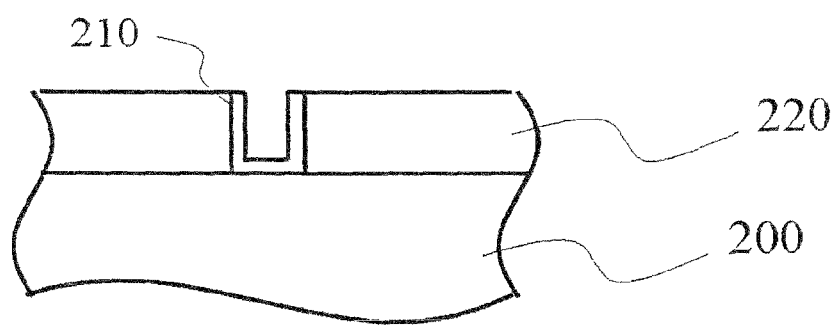
Figure 11D:
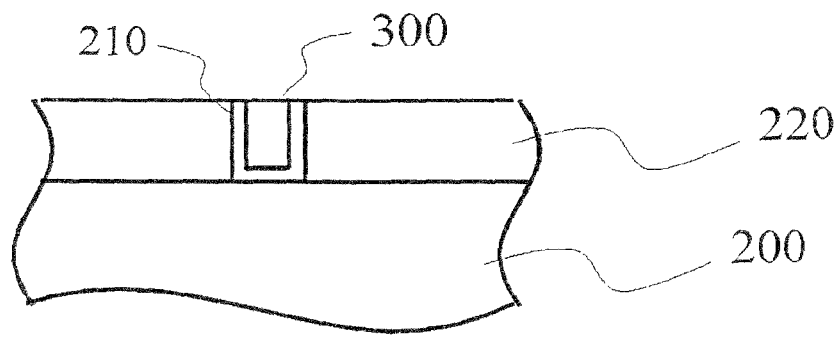

FIG. 10 is a schematic view illustrating a main-part cross-sectional structure of the semiconductor device manufactured by a manufacturing method according to the embodiment. That is, FIG. 10 shows the main-part cross-sectional structure of MOSFET (Metal Oxide Semiconductor Field Effect Transistor) constituting the semiconductor integrated circuit.

A surface portion of the silicon substrate is separated by the element isolation region 101, and MOSFET is formed in each separated well 102. Each MOSFET has a source region 107, a drain region 108, and a channel 103 provided therebetween. A gate electrode 106 is provided on the channel 103 through a gate insulating film 104. An LDD (lightly doped drain) region 103D is provided between the source and drain regions 107 and 108 and channel 103 in order to prevent the so-called "short channel effect." A gate sidewall 105 adjacent to the gate electrode 106 is provided on the LDD region 103D. The gate sidewall 105 is provided in order to form the LDD region 103D in a self-alignment manner.

A silicide layer 119 is provided on the source and drain regions 107 and 108 and the gate electrode 106 in order to improve the contact with the electrode. The structures are covered with a first insulating interlayer 110, a second insulating interlayer 111, and a third insulating interlayer 112. A source contact 113S, a gate contact 113G, and a drain contact 113D are formed in the via hole penetrating a first insulating interlayer 110, a second insulating interlayer 111, and a third insulating interlayer 112. The barrier metal 280 (260) formed by the method described with reference to FIGS. 7 to 9 is provided between the contacts 113S, 113G, and 113D and the Insulating interlayers 110, 111, and 112. For example, the first insulating interlayer 110 and the third insulating interlayer 112 can be made of silicon nitride, and the second insulating interlayer ill can be made of silicon oxide.

Then, a fourth insulating interlayer 114 and a fifth insulating interlayer 115 are further formed on the structure. The source interconnect 116S, the gate interconnect 116G, and the drain interconnect 116S are filled and formed in the via hole penetrating a fourth insulating interlayer 114 and a fifth insulating Interlayer 115. The barrier metal 280 (260) is also provided between the interconnects 116S, 116G, and 116D and the insulating interlayers 114 and 115 by the method described with reference to FIGS. 1 to 9. The fourth insulating interlayer 114 can be made of silicon oxide and the fifth insulating interlayer 115 can be made of silicon nitride.

Thus, according to the embodiment, the highly reliable semiconductor device can be realized by providing the barrier metal 280 (260) obtained by the method of the invention between the contact or the interconnect and the insulating interlayer.

As described above, the preferred embodiment of the invention is described above with reference to the specific examples. However, the invention is not limited to these specific examples.

For example, design variations of the base substance 200, the silicon compound 220, the metal nitride 240, the method and condition for generating the reducing plasma P, and the like which are adopted in the invention are also included in the score of the invention as long as the design variations include the substance of the invention. In addition to the example shown in FIG. 10, the base substance 200 provided under the insulating interlayer 220 having various kinds of the semiconductor chips or the various kinds of structures can be formed. The thickness of the insulating interlayer, the number of openings H (via holes), and the size and shape of the opening H (via hole) necessary to the semiconductor integrated circuit and various semiconductor chips can also be used by appropriate selection.

It is understood for a person skilled in the art that design variations and modifications of the semiconductor device and the manufacturing method thereof which include a constituent of the invention could be made.

It is apparent that the present invention is not limited to the above embodiment, which may be modified and changed without departing from the scope and spirit of the invention.

What is claimed is:

1. A method of manufacturing a semiconductor device comprising:
   forming a first layer made of a material containing silicon on a base substance;
   forming a second layer containing metal and nitrogen on said first layer; and
   exposing said second layer to active species obtained from plasma in an atmosphere including reducing gas so that the silicon in said first layer diffuses into said second layer,
   wherein said reducing gas is a mixed gas of hydrogen gas and helium gas, and
   wherein said second layer is changed to a layer including the silicon by exposing said second layer to said active species.

2. A method of manufacturing a semiconductor device according to claim 1, wherein said first layer is made of any one of materials selected from a group including silicon oxide, silicon carbide, silicon nitride, silicon oxycarbide, silicon oxynitride, and silicon oxycarbonitride.

3. A method of manufacturing a semiconductor device according to claim 1, wherein said second layer contains at least a material selected from a group including tantalum (Ta), titanium (Ti), tungsten (W), and zirconium (Zr).

4. A method of manufacturing a semiconductor device according to claim 1, wherein said second layer is formed by atomic layer deposition method.

5. A method of manufacturing a semiconductor device according to claim 1, wherein a concentration of said hydrogen gas in said mixed gas ranges not less than 1% and not more than 10%.

6. A method of manufacturing a semiconductor device according to claim 1, wherein said second layer is changed to a layer, in which metal concentration of said second layer is decreased toward a direction of said base substance while silicon concentration of said second layer is increased toward said direction of said base substance, by exposing said second layer to said active species.

7. A method of manufacturing a semiconductor device according to claim 1, wherein the step of exposing said second layer is performed at a flow rate of said mixed gas of 50 to 200 sccm, a pressure of said mixed gas of 20 to 50 mTorr, and a substrate temperature of 20 to 150° C.

* * * * *